United States Patent
Kikuchi (10) Patent No.: US 7,741,691 B2
(45) Date of Patent: Jun. 22, 2010

(54) SEMICONDUCTOR PHOTODETECTOR

(75) Inventor: Matobu Kikuchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 152 days.

(21) Appl. No.: 12/204,910

(22) Filed: Sep. 5, 2008

(65) Prior Publication Data

US 2009/0267169 A1    Oct. 29, 2009

(30) Foreign Application Priority Data

Apr. 28, 2008    (JP)    ............... 2008-117603

(51) Int. Cl.
*H01L 31/0232*    (2006.01)
(52) U.S. Cl. ..................... 257/461; 257/436
(58) Field of Classification Search .......... 257/233, 257/292, 436, 460, 461, 186, 190, 191, 438, 257/458, 431, 432, 199, 448, 457, 459
See application file for complete search history.

(56) References Cited

U.S. PATENT DOCUMENTS

| | | | | |
|---|---|---|---|---|
| 5,568,311 | A * | 10/1996 | Matsumoto | ............... 359/344 |
| 6,518,638 | B1 * | 2/2003 | Kuhara et al. | ............... 257/431 |
| 2003/0178636 | A1 * | 9/2003 | Kwan et al. | ............... 257/186 |

FOREIGN PATENT DOCUMENTS

| | | | |
|---|---|---|---|
| JP | 1-205573 | A | 8/1989 |
| JP | 02-106979 | * | 4/1990 |
| JP | 4-116977 | A | 4/1992 |
| JP | 2003-179249 | A | 6/2003 |
| JP | 2004-241533 | A | 8/2004 |
| JP | 2005-159002 | A | 6/2005 |

OTHER PUBLICATIONS

Machine translation of Abstract of the JP 02-106979 has been attached.*

* cited by examiner

*Primary Examiner*—Wai-Sing Louie
*Assistant Examiner*—Bilkis Jahan
(74) *Attorney, Agent, or Firm*—Leydig, Voit & Mayer, Ltd.

(57) ABSTRACT

A semiconductor photodetector includes a semiconductor substrate of a first conductivity type, a light absorption layer of the first conductivity type on the semiconductor substrate and absorbing light, a diffraction grating layer on the light absorption layer and including a diffraction grating diffracting light, a first light transmissive layer of a second conductivity type on the diffraction grating layer and transmitting light, and a second light transmissive layer of the first conductivity type on the diffraction grating layer and surrounding the first light transmissive layer, the second light transmissive layer transmitting light. The diffraction grating surrounds a region of the diffraction grating layer that is directly below the first light transmissive layer.

5 Claims, 8 Drawing Sheets

SEMICONDUCTOR PHOTODETECTOR

BACKGROUND OF THE INVENTION

1. Field of the Invention

The present invention relates to a semiconductor photodetector of the type that receives incident light on its top surface, and more particularly to a semiconductor photodetector adapted to have an increased incident light absorption efficiency and increased response speed.

2. Background Art

When a general semiconductor photodetector is operated to receive light, a reverse bias is applied to its PN junction to form a depletion layer. The light incident through the light receiving surface of the semiconductor photodetector is absorbed by its light absorption layer, which is a region with a narrow energy band, resulting in the generation of carriers within the absorption layer. Since the depletion layer is formed in the absorption layer, the carriers generated by the light absorption are accelerated by the depletion layer. It should be noted that the flow of these carriers results in an electric current component.

There is a need to improve the light absorption efficiency of such semiconductor photodetectors, since this efficiency primarily determines the efficiency of converting the incident light into carries. That is, the light absorption efficiency of a semiconductor photodetector is a measure for indicating the quantity of carriers generated within its depletion layer when the photodetector receives a given amount of incident light. The higher the absorption efficiency, the better, since the incident light-to-current conversion efficiency increases with increasing absorption efficiency. [Techniques for improving the light absorption efficiency are disclosed in Japanese Laid-Open Patent Publication Nos. 1-205573 (1989), 2005-159002, 2003-179249, and 2004-241533.]

Further, there is also a need to increase the response speed of semiconductor photodetectors in order to accommodate high speed modulation. The response speed of a semiconductor photodetector is the time required for the photodetector to generate an electric current after receiving incident light on its light receiving surface. It should be noted that if the current generated in the semiconductor photodetector includes a delayed component, it may prevent the photodetector from accommodating high speed modulation. [A technique for improving the response speed is disclosed in Japanese Laid-Open Patent Publication No. 4-116977 (1992).]

Figure 14:
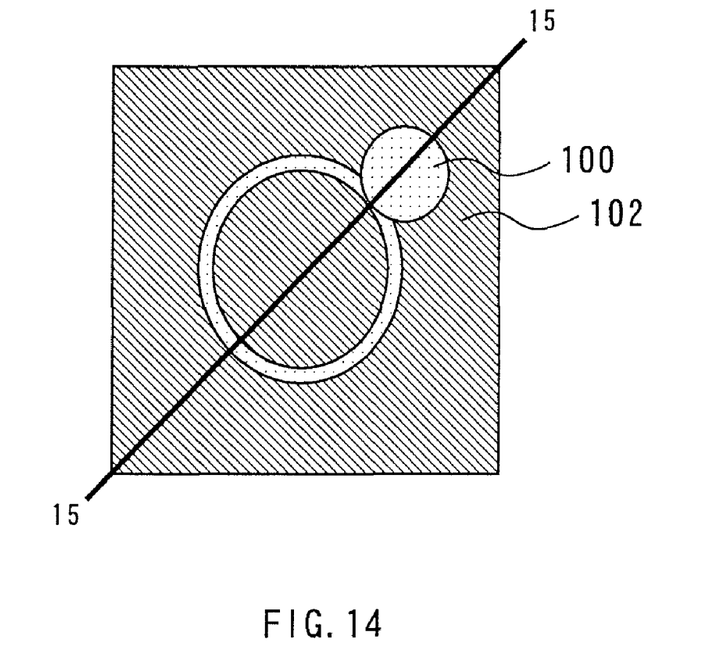
FIG. 14 is a plan view of semiconductor photodetector including no diffraction grating.
Figure 15:
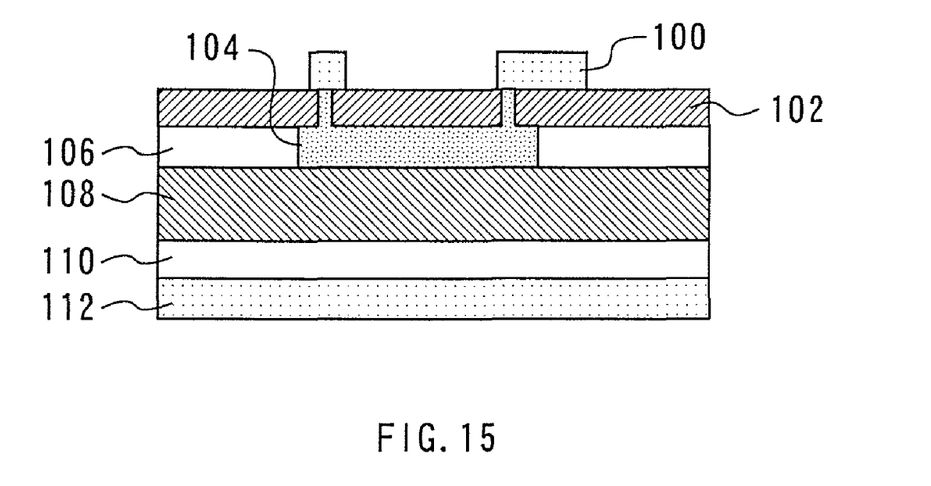
FIG. 15 is a cross-sectional view taken along line 15-15 of FIG. 14.

It is common for semiconductor photodetectors to have top and bottom electrodes formed on their top and bottom surfaces, respectively. It should be noted that the top surface is designed to be a light receiving surface. FIGS. 14 and 15 show an exemplary semiconductor photodetector having such top and bottom electrodes. Specifically, FIG. 14 is a plan view as viewed from the top surface of the semiconductor photodetector. In FIG. 14 a top electrode 100 is shown which is formed on an insulating film 102. FIG. 15 is a cross-sectional view taken along line 15-15 of FIG. 14. Referring to FIG. 15, a first light transmissive layer 104 of a second conductivity type and a second light transmissive layer 106 of a first conductivity type are formed under the insulating film 102. Both the first and second light transmissive layers 104 and 106 allow light to pass through. A light absorption layer 108 of the first conductivity type is formed under the first and second light transmissive layers 104 and 106. A semiconductor substrate 110 of the first conductivity type underlies the light absorption layer 108. Further, a bottom electrode 112 is formed on the bottom surface of the semiconductor substrate 110.

Figure 16:
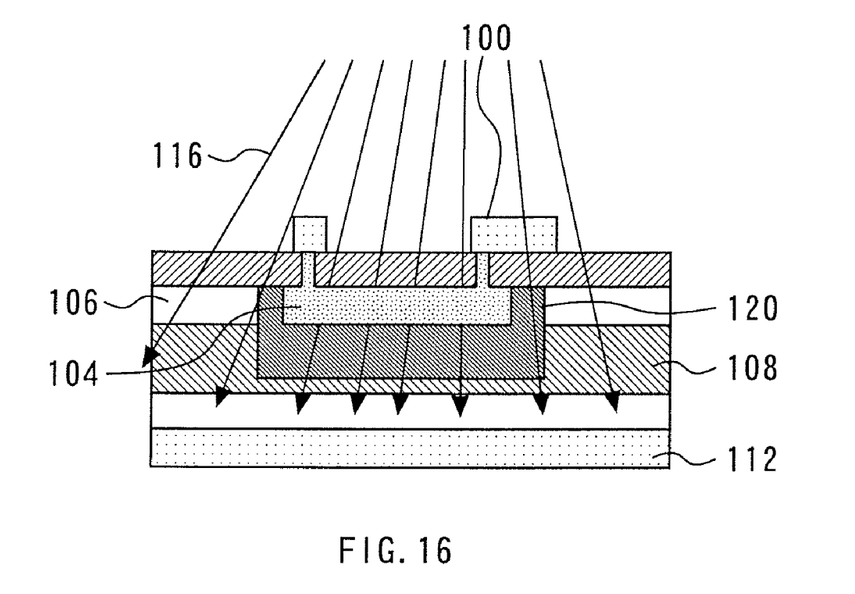
FIG. 16 shows an optical pass of incident light on semiconductor photodetector including no diffraction grating.

In this semiconductor photodetector, it is necessary to decrease the distance between the top electrode 100 and the bottom electrode 112 in order to reduce the driving bias voltage and thereby reduce the power consumption. FIG. 16 shows a semiconductor photodetector with a thinned light absorption layer when a driving bias voltage is applied between the top electrode 100 and the bottom electrode 112 of the photodetector. Referring to FIG. 16, the applied driving bias causes a depletion layer 120 to be formed between the first light transmissive layer 104 and the second light transmissive layer 106 and between the first light transmissive layer 104 and the light absorption layer 108. When the semiconductor photodetector with the depletion layer 120 formed therein receives incident light, 116, through its light receiving surface, the light absorption layer 108 absorbs it, thereby generating carriers therein. The depletion layer 120 then accelerates these carriers, thereby generating an electric current component.

As can be seen from the foregoing description, increasing the number of carriers generated in the semiconductor photodetector requires an increase in the thickness of the light absorption layer 108 to increase the percentage of the light absorbed in the layer. However, an increase in the thickness of the light absorption layer 108 means an increase in the travel distance of the generated carriers, resulting in reduced response speed of the semiconductor photodetector.

Figure 17:
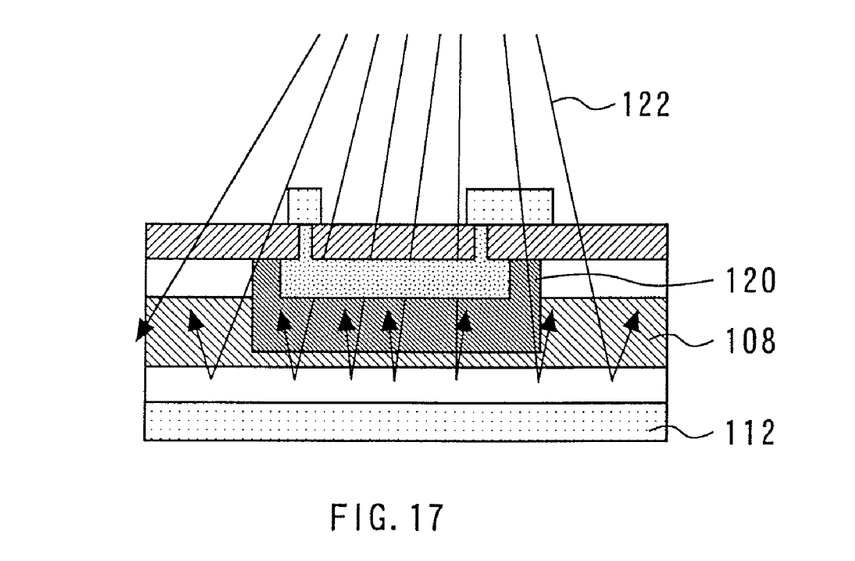
FIG. 17 shows an optical pass of incident light on semiconductor photodetector including no diffraction grating.

Referring now to FIG. 17, it happens that some of the light (122) incident on the light receiving surface passes through the light absorption layer 108 without being absorbed. The light, 122, that has transmitted through the light absorption layer 108 is reflected by the bottom electrode 112, etc. The reflected light 122 may be absorbed by the light absorption layer 108 at a location away from the depletion layer 120. In such a case, the carriers generated by this absorption take a certain time to reach the depletion layer 120 and result in an electric current component. That is, this current component is delayed from those resulting from the carriers generated when light is absorbed by the light absorption layer 108 at locations in or near the depletion layer 120. It should be noted that a semiconductor photodetector cannot achieve high response speed if its photoelectric current includes such a delayed component.

SUMMARY OF THE INVENTION

The present invention has been devised to solve the above problems. It is, therefore, an object of the present invention to provide a semiconductor photodetector whose light absorption layer has a reduced thickness to achieve increased response speed, and which is yet adapted to have an increased light absorption efficiency.

According to one aspect of the present invention, a semiconductor photodetector includes a semiconductor substrate of a first conductivity type, a light absorption layer of the first conductivity type formed on the semiconductor substrate and absorbing light, a diffraction grating layer formed on the light absorption layer and including a diffraction grating for diffracting light, a first light transmissive layer of a second conductivity type formed on the diffraction grating layer and transmitting light, and a second light transmissive layer of the first conductivity type formed on the diffraction grating layer and around the first light transmissive layer, the second light transmissive layer transmitting light. The diffraction grating is formed to surround a region directly below the first light transmissive layer.

According to another aspect of the present invention, a semiconductor photodetector includes a semiconductor substrate of a first conductivity type, a diffraction grating layer formed on the semiconductor substrate and including a diffraction grating for diffracting light, a light absorption layer of the first conductivity type formed on the diffraction grating layer and absorbing light, a first light transmissive layer of a second conductivity type formed on the light absorption layer and transmitting light, a second light transmissive layer of the first conductivity type formed on the light absorption layer and around the first light transmissive layer, the second light transmissive layer transmitting light, and a bottom electrode formed on a bottom surface of the semiconductor substrate. The diffraction grating is formed to surround a region directly below the first light transmissive layer.

Other and further objects, features and advantages of the invention will appear more fully from the following description.

DETAILED DESCRIPTION OF THE PREFERRED EMBODIMENTS

First Embodiment

Figure 1:
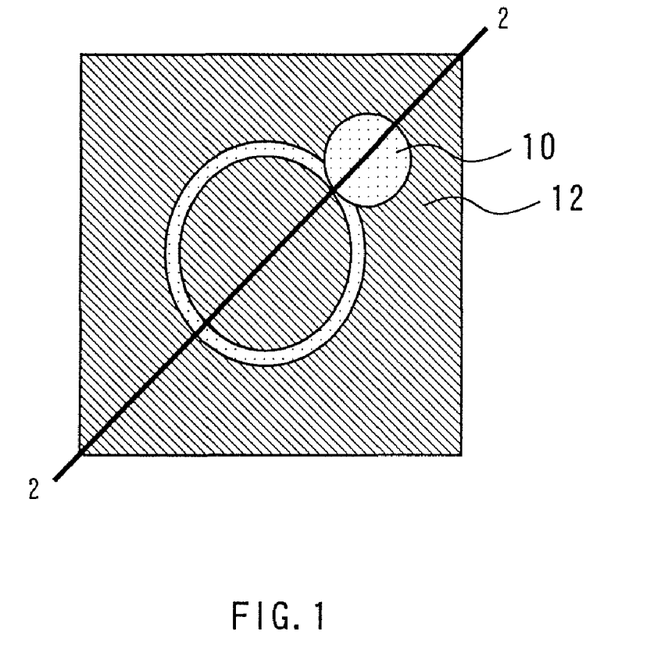
FIG. 1 is a plan view of a semiconductor photodetector according to a first embodiment of the present invention.
Figure 2:
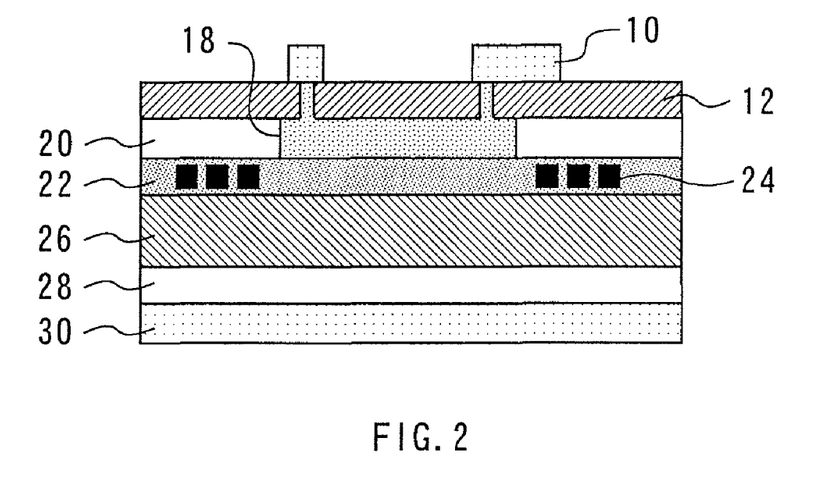
FIG. 2 is a cross-sectional view taken along line 2-2 of FIG. 1.

FIG. 1 is a plan view of a semiconductor photodetector according to a first embodiment of the present invention. In this semiconductor photodetector, a top electrode 10 is formed on an insulating film 12. This top electrode 10 has a shape including annular and circular portions tangential to each other (as viewed in plan). FIG. 2 is a cross-sectional view taken along line 2-2 of FIG. 1. The configuration of the semiconductor photodetector of the present embodiment will now be described with reference to FIG. 2. The semiconductor photodetector includes a semiconductor substrate 28 of a first conductivity type, and a light absorption layer 26 of the same conductivity type is formed on the semiconductor substrate 28. The light absorption layer 26 absorbs light and generates carriers.

On the light absorption layer 26 is formed a diffraction grating layer 22 which includes a diffraction grating 24 to diffract light. A first light transmissive layer 18 of a second conductivity type covers a portion of the diffraction grating layer 22. The first light transmissive layer 18 allows light to pass through. Further, a second light transmissive layer 20 of the first conductivity type is formed on the diffraction grating layer 22 so as to enclose and contact the periphery of the first light transmissive layer 18.

Figure 6:
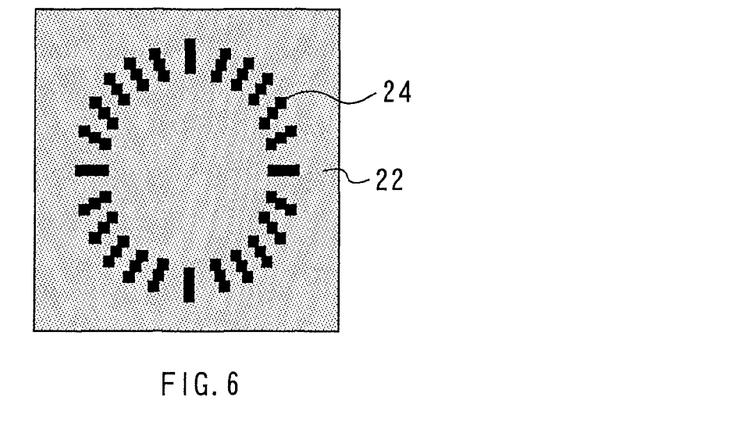
FIG. 6 shows configuration of diffraction grating includes a plurality of point-like grating elements.
Figure 7:
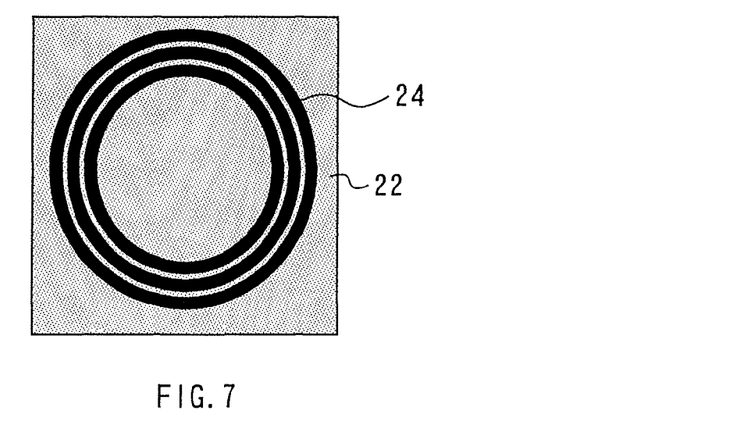
FIG. 7 shows configuration of diffraction grating includes a plurality of annular grating elements.
Figure 8:
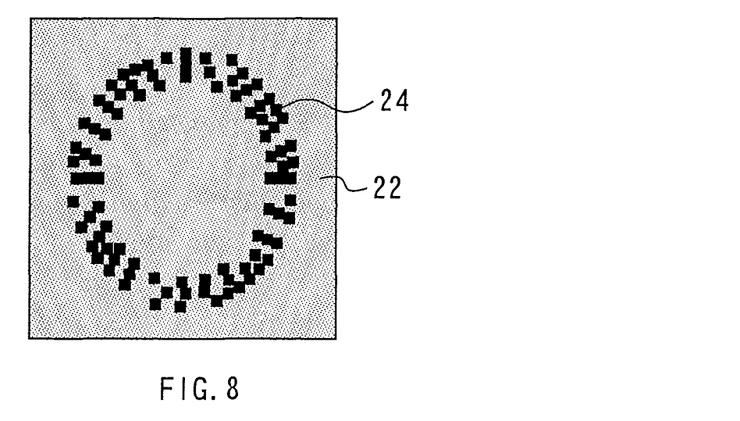
FIG. 8 shows configuration of diffraction grating includes a plurality of unevenly distributed point-like grating elements.

It should be noted that the diffraction grating 24 is formed to surround the region of the diffraction grating layer 22 immediately below the first light transmissive layer 18. That is, the diffraction grating 24 does not extend into this region underlying the first light transmissive layer 18; the grating 24 is disposed around and in contact with the periphery of the region. In the above example, the diffraction grating 24 has a configuration as shown in FIG. 6, that is, it includes a plurality of point-like grating elements formed in the diffraction grating layer 22. However, the present embodiment requires only that the diffraction grating 24 be formed to surround that region of the diffraction grating layer 22 directly below the first light transmissive layer 18. Therefore, the diffraction grating 24 may be made up of a plurality of annular grating elements, as shown in FIG. 7, or it may be made up of a plurality of unevenly distributed point-like grating elements, as shown in FIG. 8.

An insulating film 12 is formed on the first and second light transmissive layers 18 and 20. On the insulating film 12 is disposed the top electrode 10 described with reference to FIG. 1. It should be noted that a portion of the first light transmissive layer 18 extends to be in contact with the top electrode 10 for establishing an electrical connection thereto.

Further, a bottom electrode 30 is formed on the bottom surface of the semiconductor substrate 28. The semiconductor substrate 28 and the second light transmissive layer 20 have bandgaps which are wide enough to avoid light absorption.

Figure 3:
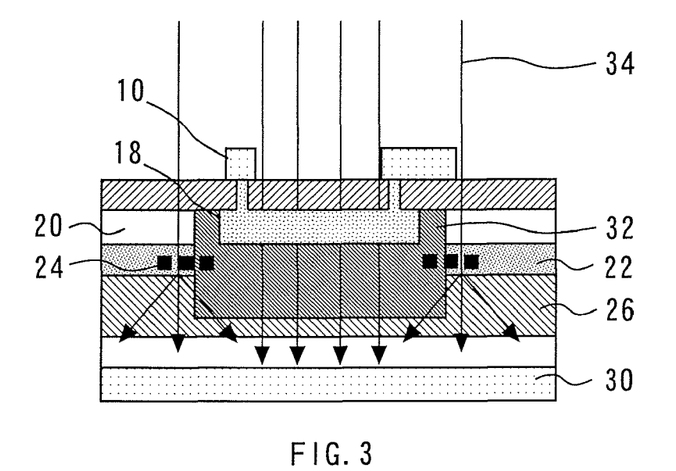
FIG. 3 shows the operation of the semiconductor photodetector.

The operation of the semiconductor photodetector will now be described with reference to FIG. 3. First, a voltage is applied between the top electrode 10 and the bottom electrode 30 such that the PN junction of the photodetector is reverse biased. It should be noted that the PN junction of the semiconductor photodetector is made up of the PN junction between the first light transmissive layer 18 of the second conductivity type and the second light transmissive layer 20 of the first conductivity type and the PN junction formed through the diffraction grating layer 22 between the first light transmissive layer 18 and the light absorption layer 26 of the first conductivity type. The reverse biasing causes a depletion layer 32 to be formed at the PN junction of the semiconductor photodetector.

Light 34 is then introduced into the light receiving surface of the semiconductor photodetector having the depletion layer 32 formed as described above. (The light receiving surface of the photodetector is its top surface on which the top electrode 10 is formed.) The introduced light 34 is absorbed by the light absorption layer 26, thereby generating carriers therein. It should be noted that these carriers are preferably generated within the depletion layer 32, since the depletion layer 32 quickly accelerates carriers formed therein to produce an electric current component.

According to the present embodiment, the diffraction grating 24 is disposed in the diffraction grating layer 22 so as to surround the region immediately below the first light transmissive layer 18. Therefore, referring to FIG. 3, the diffraction grating 24 diffracts the light that has passed through an undepleted portion of the second light transmissive layer 20 immediately adjacent the depletion layer 32 (this light being hereinafter referred to as the "outer" light, and the undepleted portion immediately adjacent the depletion layer 32 being hereinafter referred to as the "depletion layer surrounding region"). More specifically, as shown in FIG. 3, the outer light is diffracted into beams (or orders) propagating in the light absorption layer 26 in different directions: those propagating toward the depletion layer 32; those propagating in the same direction as the outer light; and those propagating away from the depletion layer 32.

Figure 18:
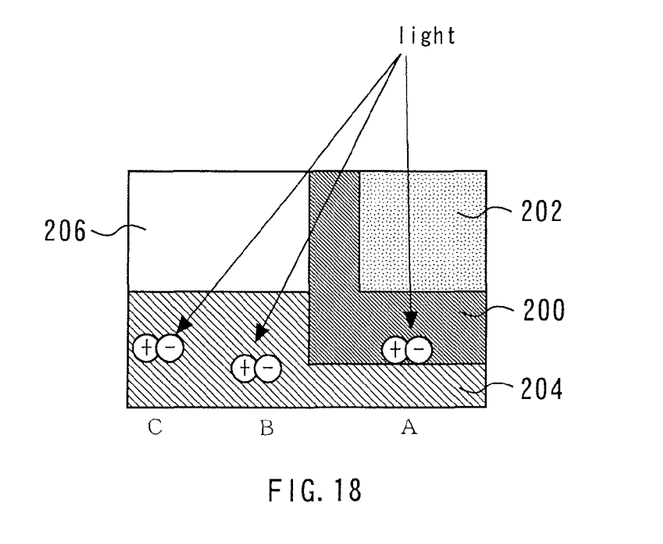
FIG. 18 shows light beams are incident on the light receiving surface of the semiconductor photodetector at different incidence angles.
Figure 19:
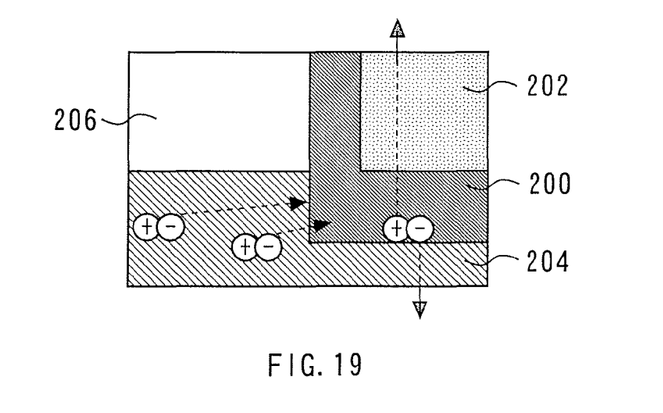
FIG. 19 shows that the carriers generated in the region B take time to reach the depletion layer.
Figure 20:
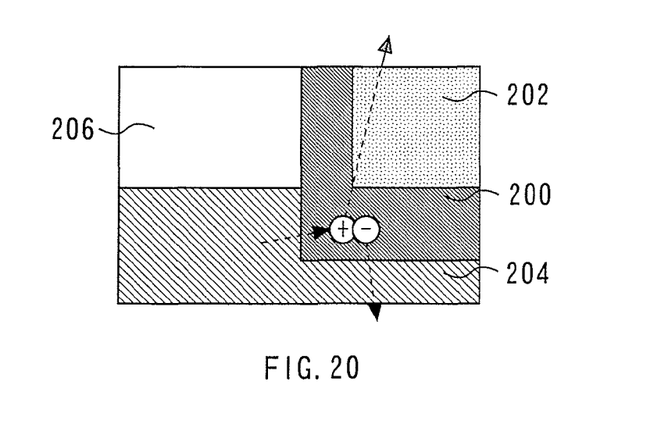
FIG. 20 shows that the carriers generated in the region B becomes delayed current.

The operation of a conventional exemplary semiconductor photodetector will now be described with reference to FIGS. 18, 19, and 20. This semiconductor photodetector includes a depletion layer 200, a first light transmissive layer 202, a light absorption layer 204, and a second light transmissive layer 206. (It does not include a diffraction grating layer.) FIGS. 18 to 20 are enlarged views of portions of the depletion layer 200, the depletion layer surrounding region (as described above), etc. Let it be assumed that light beams are incident on the light receiving surface of the semiconductor photodetector at different incidence angles (or from different directions), as shown in FIG. 18. Some of these beams are absorbed by the light absorption layer 204 or the depletion layer 200 without being reflected by the bottom electrode, thereby generating carriers, which eventually result in electric current components. As shown in FIG. 18, such beams may be absorbed by the light absorption layer 204 and the depletion layer 200 at three representative locations.

That is, carriers may be generated in the depletion layer 200 (as indicated by A in FIG. 18), in a region of the light absorption layer 204 adjacent the depletion layer 200 (as indicated by B in FIG. 18), and in a region of the light absorption layer 204 away from the depletion layer 200 (as indicated by C in FIG. 18). It is desired that as many of these carriers as possible be generated within the depletion layer, since they are quickly accelerated by the depletion layer to result in electric current components. On the other hand, the carriers generated in the region B take time to reach the depletion layer 200 (see FIG. 19). Therefore, it is preferable to reduce the quantity of these carriers, since they form delayed current components, as shown in FIG. 20, and act to reduce the response speed of the semiconductor photodetector. Further, no or only a small percentage of the carriers generated in the region C can reach the depletion layer 200, meaning that these carriers can be ignored in terms of the light absorption efficiency and the response speed of the semiconductor photodetector.

In this conventional semiconductor photodetector, only the carriers generated within the depletion layer are quickly accelerated by the depletion layer to result in electric current components, as can be seen from the foregoing description. That is, only these carriers contribute to allowing the semiconductor photodetector to convert light into electric current at high speed. It should be noted that such carriers are generated by only the beams directly incident on the depletion layer 200, as shown in FIG. 18. That is, the conventional semiconductor photodetector is disadvantageous in that its light absorption efficiency is low since a considerable portion of the light incident through its light receiving surface produces delayed electric current components.

Figure 4:
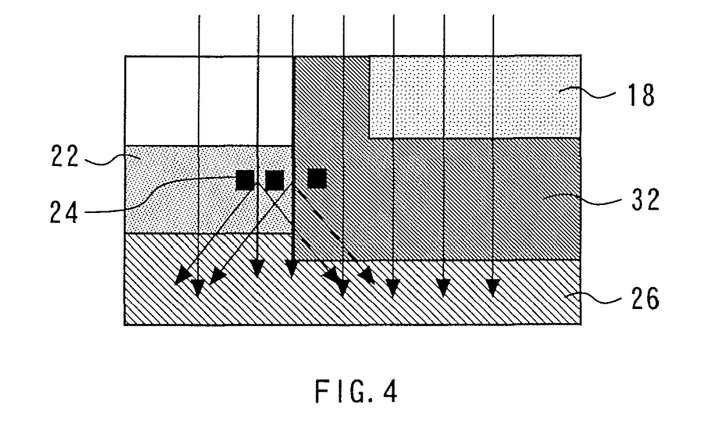
FIG. 4 is an enlarged view of the depletion layer surrounding region and adjacent regions.

In the semiconductor photodetector of the present embodiment, on the other hand, a portion of the outer light (defined above with reference to FIG. 3) is diffracted to propagate toward the depletion layer 32, leading to an increase in the amount of light incident to the depletion layer 32, as shown in FIG. 4, which is an enlarged view of the depletion layer surrounding region and adjacent regions. This increases the light absorption efficiency of the semiconductor photodetector.

Figure 5:
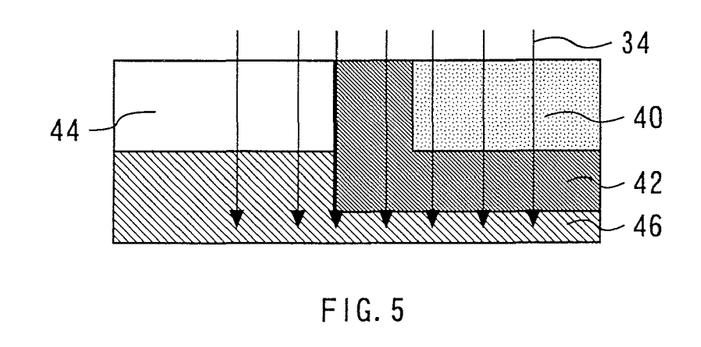
FIG. 5 shows semiconductor photodetector including no diffraction grating.

Referring to FIG. 5, in the case of a semiconductor photodetector including no diffraction grating, the same intensity of light passes through the depletion layer surrounding region (and the underlying region) as through the other regions. The carriers generated in the light absorption layer, 46, directly below the depletion layer surrounding region must travel a distance to reach the depletion layer, 42, meaning that there is a time lag before these carriers are accelerated to result in electric current components. Therefore, the carriers generated in the region of the light absorption layer directly below the depletion layer surrounding region or its vicinity act to reduce the response speed of the semiconductor photodetector if they reach the depletion layer 42 and form electric current components.

In the case of the semiconductor photodetector of the present embodiment, on the other hand, the light incident to the depletion layer surrounding region is diffracted by the diffraction grating into beams propagating in different directions: those propagating toward the depletion layer; those propagating in the same direction as the incident light; and those propagating away from the depletion layer. The beams propagating toward the depletion layer contribute to the generation of carriers within the depletion layer, and these carriers are quickly accelerated by the depletion layer. That is, these beams do not cause any reduction in the response speed of the semiconductor photodetector. The beams propagating in the same direction as the incident light have reduced intensity as a result of the action of the diffraction grating and, therefore, hardly generate carriers in the light absorption layer directly below the depletion layer surrounding region. On the other hand, the beams propagating away from the depletion layer can generate carriers in the light absorption layer at a location away from the depletion layer. However, these carriers often disappear before reaching the depletion layer. Thus, the diffraction grating of the present embodiment reduces the generation of carriers in the light absorption layer directly below the depletion layer surrounding region (which generation leads to a reduction in the response speed of the semiconductor photodetector), thereby increasing the response speed of the semiconductor photodetector.

Although in the present embodiment the diffraction grating is formed to surround the region of the diffraction grating layer directly below the first light transmissive layer, it is to be understood that in other embodiments it may have a different configuration. That is, one concept of the present invention is that light traveling along outside the depletion layer may be deflected toward the depletion layer to increase the light absorption efficiency of the semiconductor photodetector. Another concept of the present invention is to reduce the passage of light through a region adjacent the depletion layer in order to increase the response speed of the semiconductor photodetector. Therefore, the diffraction grating may have any configuration that embodies these concepts.

Second Embodiment

Figure 9:
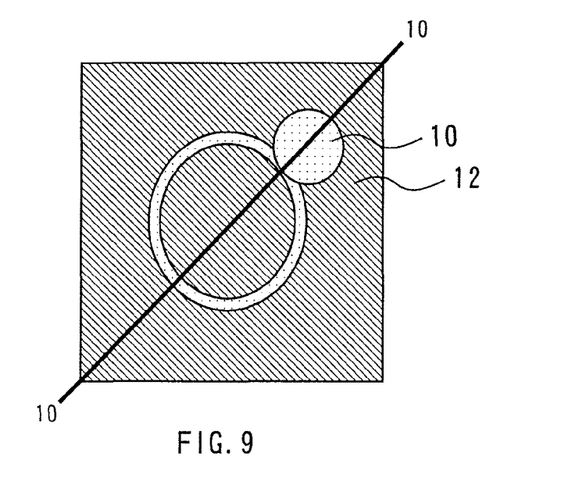
FIG. 9 is a plan view of a semiconductor photodetector according to a second embodiment.
Figure 10:
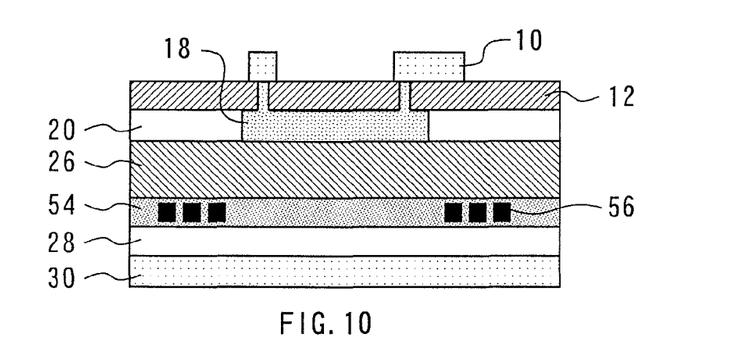
FIG. 10 is a cross-sectional view taken along 10-10 of FIG. 9.

A second embodiment of the present invention relates to a semiconductor photodetector with increased response speed. FIG. 9 is a plan view of this semiconductor photodetector, and FIG. 10 is a cross-sectional view taken along 10-10 of FIG. 9. It should be noted that in FIGS. 9 and 10 components common to the first embodiment are designated by the same reference numerals and a description of these components will not be provided herein.

The configuration of the semiconductor photodetector of the present embodiment will be described with reference to FIG. 10. According to the present embodiment, a diffraction grating layer 54 is disposed between the light absorption layer 26 and the semiconductor substrate 28. Like the diffraction gating 24 of the first embodiment, a diffraction grating 56 is disposed to surround the region of the diffraction grating layer 54 directly below the first light transmissive layer 18. Examples of the configuration of the diffraction grating 56 of the present embodiment include but are not limited to those shown in FIGS. 6, 7, and 8.

Figure 11:
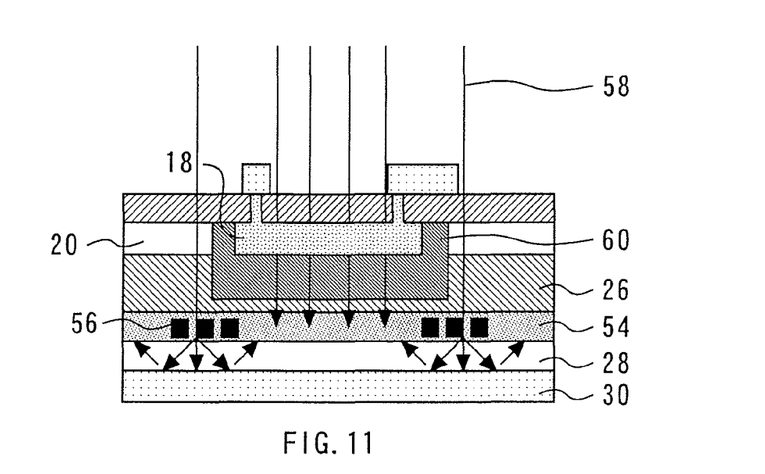
FIG. 11 is a diagram illustrating how incident light propagates within the semiconductor photodetector of the second embodiment.

FIG. 11 is a diagram illustrating how incident light, 58, propagates within the semiconductor photodetector of the present embodiment. It should be noted that since the light absorption layer 26 is thin, only part of the light 58 is absorbed by the light absorption layer 26 during its first passage through the layer. Some of the unabsorbed light enters the diffraction grating 56 (disposed to surround the region of the diffraction grating layer 54 directly below the first light transmissive layer 18) and is diffracted into beams. These beams are reflected by the bottom electrode 30. Some of the reflected beams propagate toward the PN junction; others return on their incoming paths; and the others propagate away from the PN junction.

In the case of a conventional semiconductor photodetector (i.e., one without the diffraction grating 56), the beams reflected by the bottom electrode 30 may travel to the light absorption layer near the depletion layer again and generate carriers therein. It takes a certain time for these carriers to reach the depletion layer, resulting in the generation of delayed electric current components. Thus, the beams reflected by the bottom electrode 30 may act to reduce the response speed of the semiconductor photodetector.

Figure 12:
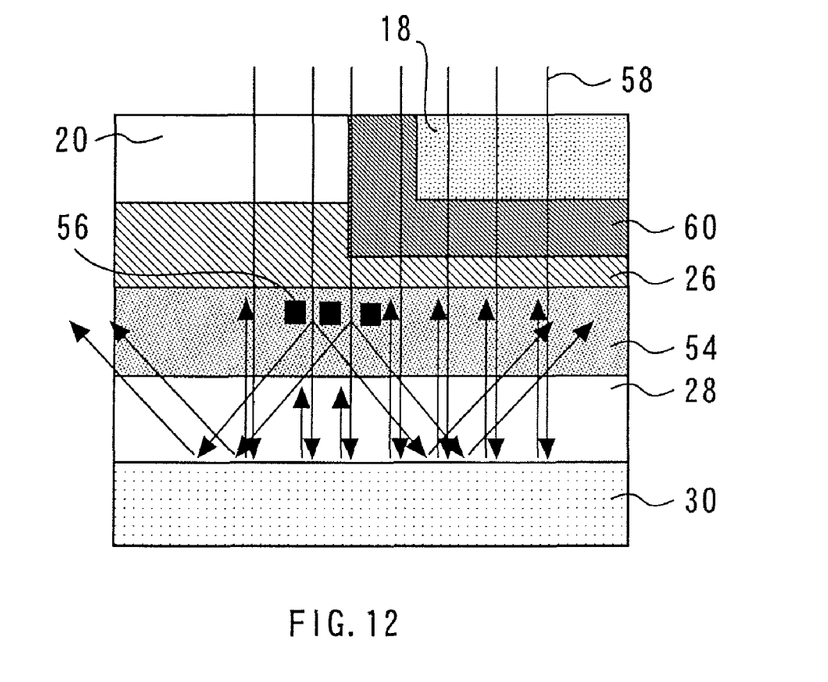
FIG. 12 is an enlarged view of a portion of FIG. 11.
Figure 13:
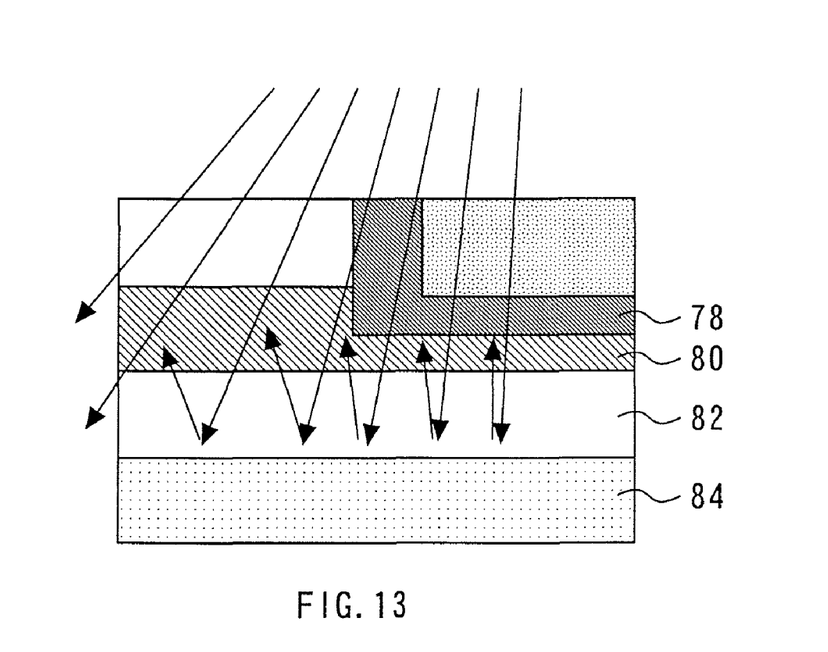
FIG. 13 shows semiconductor photodetector including no diffraction grating.

The configuration of the semiconductor photodetector of the present embodiment avoids this problem. That is, the diffraction grating (56) diffracts the above beams passing near the depletion layer again after being reflected by the bottom electrode 30. FIG. 12 is an enlarged view of a portion of FIG. 11. As shown in FIG. 12, the light that has not been absorbed by the light absorption layer 26 during its first passage near the depletion layer, 60, is diffracted into beams by the diffraction grating 56 (before being reflected by the bottom electrode 30). These beams are then reflected by the bottom electrode 30. The reflected beams include: those propagating toward the PN junction; those returning on their incoming paths; and those propagating away from the PN junction.

The beams propagating toward the PN junction are preferred to increase the amount of light absorbed in the depletion layer and thereby to increase the response speed of the semiconductor photodetector. The beams returning on their incoming paths have reduced intensity as a result of their passage through the diffraction grating layer 56, meaning that the carriers generated near the depletion layer 60 by these beams do not have much adverse effect on the response speed of the semiconductor photodetector. Further, the beams propagating away from the PN junction may also be absorbed by the light absorption layer 26, thereby generating carriers. However, these carriers cannot reach the depletion layer 60, since they are generated at a location away from the depletion layer 60.

As described above, in the semiconductor photodetector of the present embodiment, the diffraction grating serves to reduce delayed electric current components due to the beams reflected by the bottom electrode, thereby increasing the response speed of the semiconductor photodetector. Further, some of the beams diffracted by the diffraction grating propagate toward the PN junction (or the depletion layer), resulting in an increase in the light absorption efficiency of the semiconductor photodetector.

Although in the present embodiment the diffraction grating is disposed to surround the region of the diffraction grating layer directly below the first light transmissive layer, it is to be understood that in other embodiments it may have a different configuration. That is, a concept of the present invention is to reduce the amount of light propagating toward the vicinity of the depletion layer again after passing near the depletion layer and after being reflected by the bottom electrode, as well as to deflect part of such light toward the depletion layer. Therefore, the diffraction grating may have any configuration that embodies this concept.

Thus the present invention can increase the light absorption efficiency and response speed of semiconductor photodetectors.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-117603, filed on Apr. 28, 2008 including specification, claims, drawings and summary, on which the Convention priority of the present application is based, are incorporated herein by reference in its entirety.

What is claimed is:

1. A semiconductor photodetector comprising:
a semiconductor substrate of a first conductivity type;
a light absorption layer of the first conductivity type on said semiconductor substrate and absorbing light;
a diffraction grating layer on said light absorption layer and including a diffraction grating diffracting light;
a first light transmissive layer of a second conductivity type on said diffraction grating layer and transmitting light; and
a second light transmissive layer of the first conductivity type on said diffraction grating layer and surrounding said first light transmissive layer, said second light transmissive layer transmitting light, wherein said diffraction grating surrounds a region of said diffraction grating layer that is directly opposite said first light transmissive layer.

2. A semiconductor photodetector comprising:

a semiconductor substrate of a first conductivity type;

a diffraction grating layer on said semiconductor substrate and including a diffraction grating diffracting light;

a light absorption layer of the first conductivity type on said diffraction grating layer and absorbing light;

a first light transmissive layer of a second conductivity type on said light absorption layer and transmitting light;

a second light transmissive layer of the first conductivity type on said light absorption layer and surrounding said first light transmissive layer, said second light transmissive layer transmitting light; and a bottom electrode on a bottom surface of said semiconductor substrate, wherein said diffraction grating surrounds a region of said diffraction grating layer that is directly opposite said first light transmissive layer.

3. The semiconductor photodetector as claimed in claim 1, wherein said diffraction grating includes a plurality of point-like grating elements.

4. The semiconductor photodetector as claimed in claim 1, wherein said diffraction grating includes a plurality of unevenly distributed point-like grating elements.

5. The semiconductor photodetector as claimed in claim 1, wherein said diffraction grating includes a plurality of annular grating elements.

* * * * *